Jan. 17, 1961    A. B. DAVENPORT    2,968,748
MONOSTABLE MULTIVIBRATOR AND AMPLIFIER CIRCUIT
Filed March 21, 1957
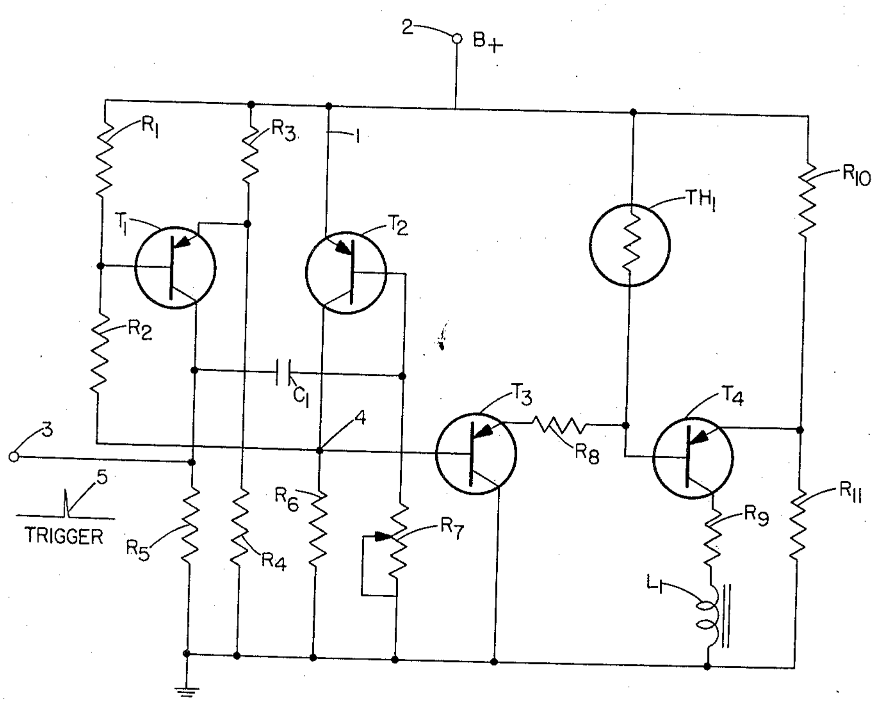
ARTHUR B. DAVENPORT
INVENTOR
BY Tillman and Kerst
ATTORNEYS United States Patent Office 2,968,748

Patented Jan. 17, 1961

2,968,748

MONOSTABLE MULTIVIBRATOR AND AMPLIFIER CIRCUIT

Arthur Bruce Davenport, Owings Mills, Md., assignor to The Bendix Corporation, a corporation of Delaware Filed Mar. 21, 1957, Ser. No. 647,556

2 Claims. (Cl. 317—148.5)

This invention relates to multivibrators and more particularly to multivibrators of the monostable type and to the problems which arise in providing an amplified signal from a transistorized version of such a circuit.

In systems required to deliver a train of high amplitude current impulses of duration controllable over a wide range, the pulse train may be produced by a monostable multivibrator and then subjected to amplification. When the system is transistorized difficulties arise in coupling the output of the multivibrator to the amplifying circuit. Output pulses of considerable duration include low frequency components which require large coupling capacitors of a size and cost which is undesirable. Furthermore, the base to collector leakage current ($I_{co}$) of the first amplifier transistor $T_3$ becomes excessive with a rise either in ambient temperature or that due to the power dissipation in the transistor, with resulting instability. This has necessitated the provision of an additional transistor to provide a low impedance discharge path for this leakage current. Otherwise this current will cause a forward bias voltage to be applied to the transistor base with resulting instability.

It is an object of this invention to eliminate a transistor from a monostable multivibrator and amplifier system capable of producing a train of energy impulses of controllable duration.

It is a further object of the invention to utilize one of the transistors of the multivibrator of such a system to provide a low impedance discharge path for leakage current in the first amplifier transistor.

These and other objects and advantages of the invention are realized in a circuit in which a direct D.C. coupling is used between the last stage of the multivibrator and the first amplifier stage. The emitter of the last stage transistor of the multivibrator is connected directly to the positive terminal of the supply source, thus providing a low impedance dissipation path for the leakage current of the first amplifier transistor.

In the drawing, the single figure is a schematic diagram of a circuit embodying the invention.

The illustrated circuit is represented as utilizing transistors of the PNP junction type. A pair of these devices, $T_1$ and $T_2$, are connected to form a monostable multivibrator. The emitter of $T_2$ is directly connected by a conductor 1 to a positive terminal 2 of a source of D.C. voltage indicated as B+. The emitter of $T_1$ is connected to the same terminal through a resistor $R_3$. A pair of resistors $R_1$ and $R_2$ form a voltage divider between the terminal 2 and a point 4 directly connected to the collector of transistor $T_2$ and by a parallel connection to the base electrode of a third transistor $T_3$, which forms the first stage of the amplifier circuit.

The base electrode of $T_1$ is connected to the junction of resistors $R_1$ and $R_2$. The collectors of $T_1$ and $T_2$ are connected to ground through respective resistors $R_5$ and $R_6$. The emitter of $T_1$ is connected to ground by way of a resistor $R_4$. The base of $T_2$ is connected to ground by way of a variable resistor $R_7$ and coupled to the collector of $T_1$ by a capacitor $C_1$. A terminal 3 connected to the collector of $T_1$ is provided for the application of triggering voltage to the circuit.

The amplifier circuit is composed of two stages, of which the transistor $T_3$ constitutes the first stage. The collector of transistor $T_3$ is directly connected to ground and its emitter is connected by a resistor $R_8$ to the base electrode of a transistor $T_4$, forming the second stage of the amplifier. The base electrode of transistor $T_4$ is also connected to the terminal 2 by way of thermister $TH_1$. The collector of transistor $T_4$ is connected to ground by way of a serial arrangement of a resistor $R_9$ and an inductor $L_1$. The emitter of transistor $T_4$ is connected to the junction of a voltage divider between the terminal 2 and ground, the voltage divider being composed of resistors $R_{10}$ and $R_{11}$.

In the operation of the above circuit, the transistor $T_1$ is normally in a non-conductive state with the voltage at its base being held by the voltage divider $R_1$, $R_2$, at a level slightly more positive than voltage at its emitter. The transistor $T_2$ is normally conducting to saturation with the voltage at its base slightly negative with respect to the voltage at its emitter, which is that of the terminal 2.

The application of a positive-going trigger impulse, as indicated by the graph 5, to the terminal 3, will cause $T_1$ and $T_2$ to change state conductively with $T_1$ conducting and $T_2$ cut off. This change is caused by the effect of the trigger impulse causing the base of $T_2$ to become more positive and thus reducing conduction in $T_2$. This causes the voltage at point 4 and also on the base of $T_1$ to become more negative due to the lowered conduction in $T_2$ and conduction in $T_1$ is thus initiated. This causes the collector of $T_1$ to become more positive and the base of $T_2$ to follow. This regenerative action results in $T_1$ conducting to saturation and $T_2$ being completely cut off.

This state will continue until the capacitor $C_1$ has discharged through $R_7$ and $R_5$ to the point where the potential at the base of $T_2$ becomes equal to the potential on the emitter of that transistor, at which time $T_2$ will again start to conduct and the multivibrator will regeneratively revert to its original state.

The pulse amplifiers $T_3$ and $T_4$ are normally in a non-conducting state due to their bases being positive with respect to their respective emitters. When the multivibrator is triggered the potential at point 4 drops toward ground causing $T_3$ to conduct. The emitter of $T_3$ and the base of $T_4$ likewise become more negative and cause $T_4$ to conduct to saturation delivering current to the load which is indicated as the inductor $L_1$.

The transistor $T_2$ serves a dual purpose in this circuit, acting as an integral part of the multivibrator, and also as a temperature stabilizing element for $T_3$. This dual function is made possible by the fact that a direct D.C. connection is made from the collector of $T_2$ to the base of $T_3$, rather than a capacitive coupling, such as has been used in previous circuits of this type. It is also made possible by the fact that the emitter of $T_2$ is directly connected to the supply voltage source, rather than being connected through a high impedance path, as in previous devices.

During the stable state of the multivibrator, $T_2$ is conducting to saturation, resulting in a voltage at point 4 which is approximately equal to that at the emitter of $T_2$ and at the terminal 2. This assures that $T_3$ is cut off and at elevated temperatures, resulting either from an ambient temperature condition or high current dissipation in $T_3$, the leakage current will flow freely through $T_2$, utilizing the low impedance path from point 4 to terminal 2. The resistance offered by $T_2$ during the condition of saturation is very low. Due to the presence of this low impedance path, the leakage current will not cause a forward bias voltage to be applied to the base of $T_3$.

During the astable state of the multivibrator the transistor $T_2$ is cut off and the base current drive applied to $T_3$ is limited only by $R_6$ and the potential at the emitter of $T_3$. The resistance value of $R_7$ determines the discharge time of $C_1$ and, consequently, the duration of the output pulse. Since the voltage at the base of $T_2$, during the estable state, is approximately that at the terminal 2 and $C_1$ discharges toward ground during the pulse, only the most linear portion of the expotential waveform of voltage at the base of $T_2$ is used to determine pulse duration. Since the conduction resistance of $T_2$ from base to emitter is very low when $T_2$ is conducting, the recovery time of the multivibrator is limited only by $C_1$ and $R_5$.

Resistors $R_8$ and $R_9$ are used as current limiters. The thermister $TH_1$ is used for temperature stabilization of $T_4$.

What is claimed is:

1. A monostable multivibrator comprising a pair of transistors and each having base, emitter and collector electrodes, means forming a regenerative feed back coupling between the base of a first of said transistors to the collector of the second transistor, means capacitively coupling the collector of said first transistor to the base of the second, a source of supply voltage, means directly connecting the emitter of said second transistor to said source, means normally biasing said multivibrator to its astable state whereby said first transistor is cut-off and said second transistor is conducting, and means applying triggering voltage to said multivibrator of such polarity and magnitude to bias said multivibrator to its astable state whereby the conductivity of said transistors is reversed for a predetermined interval; a third and a fourth transistor each having base, emitter and collector electrodes, means normally biasing said third transistor to cut-off during said stable state of said multivibrator, the base of said third transistor during cut-off being inherently subject to a forward bias voltage condition resulting from thermally generated leakage current, means including a positive coefficient resistor and a negative coefficient resistor connecting the emitter and collector of said third transistor across said voltage supply, said positive and negative resistors forming a junction therebetween, means of negligible impedance directly connecting the base of said third resistor to the collector of said second transistor of said multivibrator during the stable state to provide a low impedance path for said thermally generated leakage current whereby said inherent forward bias condition is prevented, means connecting the base of said fourth transistor to said junction, means including an inductance connecting the collector of said fourth transistor to said source, and voltage divider means connecting the emitter of said fourth transistor across said voltage supply.

2. A monostable multivibrator and amplifier circuit, said multivibrator comprising a pair of transistors each having base, emitter and collector electrodes, a resistor connecting the emitter of the first of said transistors to the positive terminal of a source of supply voltage, means directly connecting the emitter of the second of said transistors to said terminal, capacitive means coupling the collector of said first transistor to the base of said second transistor, means so biasing the base of said first transistor that said first transistor is normally cut-off and said second transistor is conducting, a resistor connected between said base of said first transistor and the collector of said second transistor, a third and a fourth transistor each having base, emitter and collector electrodes, means normally biasing said third transistor to cut-off during the cut-off of said first transistor, the base of said third transistor during cut-off being inherently subject to the build up of a forward bias condition resulting from thermally generated leakage current, means including a positive coefficient resistor and a negative coefficient resistor connecting the emitter and collector of the third transistor across said voltage supply, said positive and negative resistors forming a junction therebetween, means of negligible impedance directly connecting the collector of said second transistor to the base of said transistor during cut-off of said third transistor providing a low impedance path for said thermally generated leakage current whereby the forward bias condition is prevented, means connecting the base of said fourth transistor to said junction, means including an inductance connecting the collector of said fourth transistor to said source, and voltage divider means connecting the emitter of said fourth transistor across said voltage supply.

References Cited in the file of this patent

UNITED STATES PATENTS

| | | |
|---|---|---|
| 2,405,237 | Ruhlig | Aug. 6, 1946 |
| 2,428,926 | Bliss | Oct. 14, 1947 |
| 2,465,185 | Anderson | Mar. 22, 1949 |
| 2,605,306 | Eberhard | July 29, 1952 |
| 2,737,587 | Prousdale | Mar. 6, 1956 |
| 2,759,104 | Skellett | Aug. 14, 1956 |
| 2,772,359 | Modiano | Nov. 27, 1956 |
| 2,776,420 | Woll | Jan. 1, 1957 |
| 2,801,338 | Keller | July 30, 1957 |
| 2,837,663 | Walz | June 3, 1958 |
| 2,857,512 | Luther | Oct. 21, 1958 |

OTHER REFERENCES

Better et al.: Publication, "Directly Coupled Transistor Circuits," June 1955, Electronics, pages 132–136.

Sulzer: "Junction Transistor," Aug. 1953, Electronics, pages 170–173; see Figs. 6B and 6E.

UNITED STATES PATENT OFFICE

CERTIFICATION OF CORRECTION

Patent No. 2,968,748 January 17, 1961

Arthur Bruce Davenport

It is hereby certified that error appears in the above numbered patent requiring correction and that the said Letters Patent should read as corrected below.

Column 3, line 11, for "estable" read -- stable --; line 13, for "expotential" read -- exponential --; line 31, for "astable" read -- stable --; line 49, for "resistor" read -- transistor --.

Signed and sealed this 13th day of June 1961.

(SEAL)
Attest:

ERNEST W. SWIDER
Attesting Officer

DAVID L. LADD
Commissioner of Patents